(12) United States Patent
Chiang et al.

(10) Patent No.: US 6,168,989 B1
(45) Date of Patent: Jan. 2, 2001

(54) PROCESS FOR MAKING NEW AND IMPROVED CROWN-SHAPED CAPACITORS ON DYNAMIC RANDOM ACCESS MEMORY CELLS

(75) Inventors: Ming-Hsiung Chiang, Taipei; Wen-Chuan Chiang, Hsin-Chu; Cheng-Ming Wu, Kao-Hsiung, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/318,924

(22) Filed: May 26, 1999

(51) Int. Cl.$^7$ ................................................ H01L 21/8242
(52) U.S. Cl. ............................................ 438/253; 438/634
(58) Field of Search .................................. 438/253, 396, 438/595, 634, 970

(56) References Cited

U.S. PATENT DOCUMENTS

| | | | |
|---|---|---|---|
| 5,663,093 | 9/1997 | Tseng et al. | 438/396 |
| 5,728,618 | 3/1998 | Tseng | 438/253 |
| 5,753,547 | 5/1998 | Ying | 438/253 |
| 5,759,892 | 6/1998 | Wang et al. | 438/254 |
| 5,811,331 | 9/1998 | Ying et al. | 438/253 |
| 5,821,141 | 10/1998 | Huang | 438/253 |
| 5,854,106 | * 12/1998 | Wu | 438/253 |
| 5,930,623 | * 7/1999 | Wu | 438/253 |
| 6,054,347 | * 12/1998 | Lin | 438/253 |

* cited by examiner

Primary Examiner—Chandra Chaudhari
(74) Attorney, Agent, or Firm—George O. Saile; Stephen B. Ackerman

(57) ABSTRACT

A method for making crown capacitors using a new and improved crown etch window process for DRAM cells is described. After forming FETs for the memory cells, a planar first insulating layer (IPO-1) is formed and bit lines are formed thereon. A second insulating layer (IPO-2) is deposited, and a first etch-stop layer and a disposable insulating layer are deposited. Contact openings are etched in the layers to the substrate, and are filled with a polysilicon to form capacitor node contact plugs. The disposable layer is removed to expose the upper portions of the plugs extending above the first etch-stop layer. A second etch-stop layer is deposited and a thick insulating layer is deposited in which capacitor openings are etched over and to the plugs. The capacitor openings can be over-etched in the thick insulating layer because the plugs extend upward thereby allowing all the plugs to be exposed across the wafer without overetching the underlying IPO-2 layer that would otherwise cause capacitor-to-bit-line shorts when the bottom electrodes are formed in the capacitor openings.

25 Claims, 5 Drawing Sheets

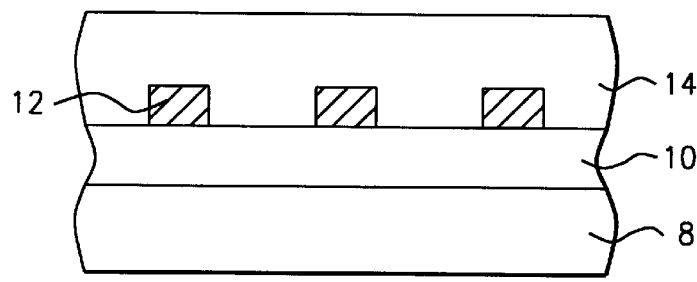
FIG. 1 - Prior Art
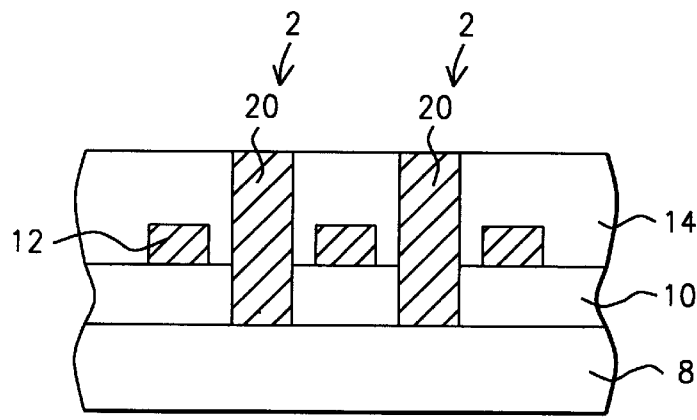
FIG. 2 - Prior Art
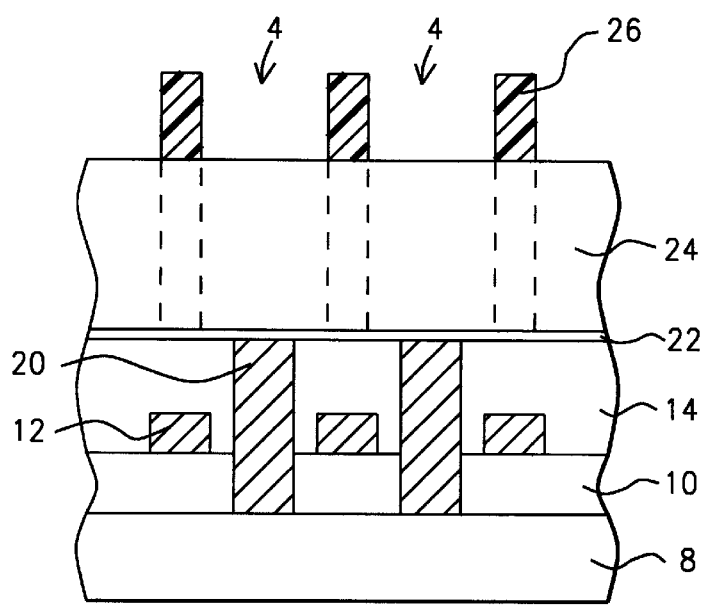
FIG. 3 - Prior Art

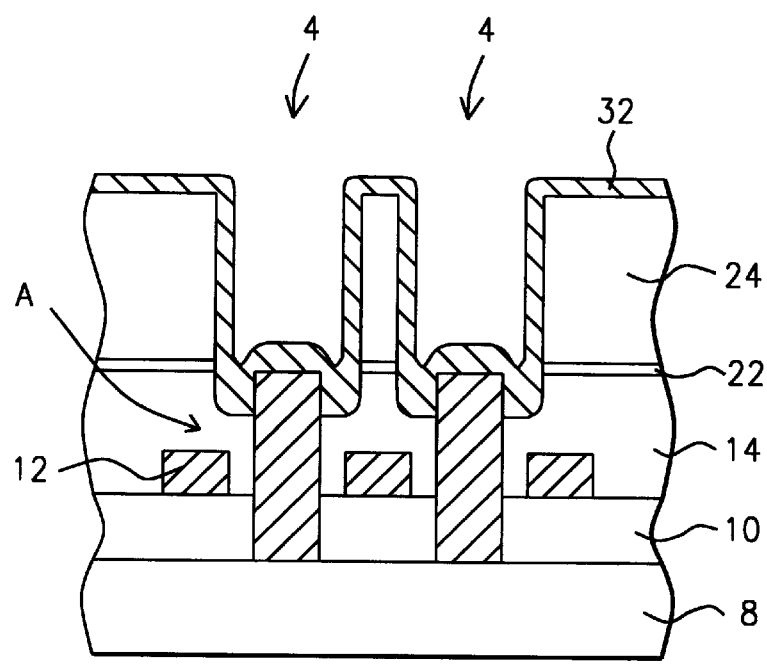
*FIG. 4 — Prior Art*
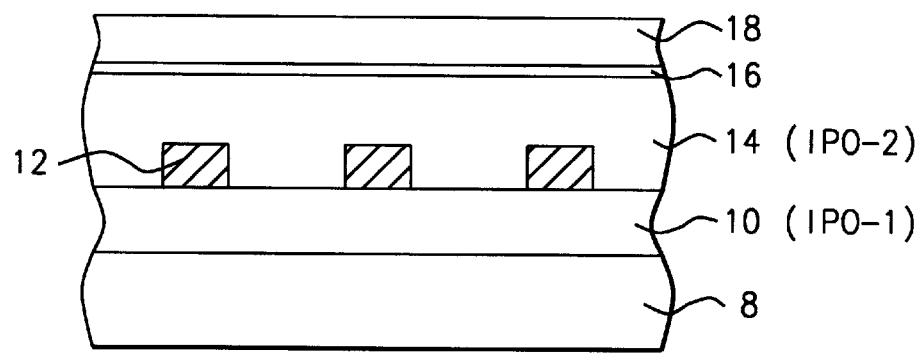
*FIG. 5*

PROCESS FOR MAKING NEW AND IMPROVED CROWN-SHAPED CAPACITORS ON DYNAMIC RANDOM ACCESS MEMORY CELLS

BACKGROUND OF THE INVENTION (1) Field of the Invention

The present invention relates to semiconductor integrated circuits, and more particularly to a method for fabricating a crown-shaped capacitor structure on dynamic random access memory (DRAM) cells with increased capacitance, and with increased process window when etching the openings in an insulator for these crown-shaped capacitors. This increase in process window avoids overetching of the IPO-2 insulator over the bit lines that would otherwise lead to bit-line-to-capacitor electrical shorts in the conventionally made crown-shaped capacitors.

(2) Description of the Prior Art

Dynamic random access memory (DRAM) circuits (devices) are used extensively in the electronics industry, and more particularly in the computer industry for storing data in binary form (1s and 0s) as charge on a storage capacitor. These DRAM devices are made on semiconductor substrates (or wafers) and then the substrates are diced to form the individual DRAM circuits (or chips). Each DRAM circuit (chip) consists in part of an array of individual memory cells that store binary data (bits) as electrical charge on the storage capacitors. Further, the information is stored and retrieved from the storage capacitors by means of switching on or off a single access transistor (by way of word lines) in each memory cell using peripheral addressing circuits, while the charge stored on the capacitors is sensed by way of bit lines and by read/write circuits formed on the peripheral circuits of the DRAM chip.

The access transistor for the DRAM device is usually a field effect transistor (FET), and the single capacitor in each cell is formed either in the semiconductor substrate as a trench capacitor, or is built over the FET in the cell area as a stacked capacitor. To maintain a reasonable DRAM chip size and improved circuit performance, it is necessary to further reduce the area occupied by the individual cells on the DRAM chip, and to form the adjacent capacitors on memory cells closer together. Unfortunately, as the cell size decreases, it becomes increasingly more difficult to fabricate stacked or trench storage capacitors with sufficient capacitance to store the necessary charge to provide an acceptable signal-to-noise level for the read circuits (sense amplifiers) to detect. The reduced charge also requires more frequent refresh cycles that periodically restore the charge on these volatile storage cells. This increase in refresh cycles further reduces the performance (speed) of the DRAM circuit.

One preferred method for making these capacitors is to make crown-shaped stacked capacitors which are built over the FETs and bit lines. However, when stacked capacitors are made using this traditional crown capacitor process, it is necessary to overetch the openings in an insulating layer for the capacitors to the cap node contact plugs to ensure that all plugs are open across the wafer. This overetching can erode the underlying insulating layer over the bit lines causing shorts between the bit lines and the capacitors. This shorting problem is best understood by reviewing the conventional process steps in FIGS. 1 through 4 below.

In the prior art, a substrate 8 having partially completed DRAM devices is insulated with a first insulating layer 10 (commonly referred to as interpolysilicon oxide-1 or IPO-1). Bit lines 12 are formed on layer 10 and a planar second insulating layer 14 (IPO-2) is formed over the bit lines, as shown in FIG. 1. The capacitors are now formed by etching openings to the source/drain areas on the substrate 8 for capacitor node contact plugs. The openings are filled with a doped polysilicon to form the plugs 20, as shown in FIG. 2. Referring to FIG. 3, an etch-stop layer 22 is deposited, and a thick third insulating layer 24 is deposited in which the crown capacitors will be formed. As still shown in FIG. 3, a photoresist mask 26 and anisotropic etching are used to etch openings 4 for the capacitors. The openings 4 are then etched in the third insulating layer 24 to the etch-stop layer 22, and the layer 22 is removed to expose the node contact plugs 20, as shown in FIG. 4.

Because of the non-uniformity in the thickness of the third insulating layer 24 and because of the etch-rate non-uniformity across the wafer, overetching is necessary to expose all of the node contact plugs 20 across the wafer. Unfortunately, this overetching can erode the underlying IPO-2 layer 14 over the bit lines 12, as depicted by point A in FIG. 4. When the bottom electrodes are formed by depositing a conducting layer 32, a reliability problem occurs in which the capacitor bottom electrode 32 can short to the bit line 12 at the eroded point A in the IPO-2 14, as shown in FIG. 4.

Several methods have been reported that increase the capacitance of the individual capacitors on a DRAM device. For example, in U.S. Pat. No. 5,811,331 to Ying, a method is described that forms a node contact that is recessed under an etch-stop layer 20. The polysilicon node contact 32 (see FIG. 9) prevents etching of the IPO-2 layer 14 when the capacitor opening is misaligned to the node contact. Ying in U.S. Pat. No. 5,753,547 provides a method for making cylindrical capacitors which have a smooth top cylindrical surface and a uniform cylindrical height. U.S. Pat. No. 5,663,093 to Tseng et al. uses a sidewall-spacer technology to make a cylindrical capacitor having a central pillar that increases cell capacitance. Tseng et al. in U.S. Pat. No. 5,728,618 teach a method for making a larger capacitor for greater capacitance per cell area. In U.S. Pat. No. 5,821,141 to Huang, a method for making a cylindrical capacitor on a DRAM having pin-plug-profile node contacts that increase the photoresist alignment tolerance for making the cylindrical crown capacitor over the plug. Wang et al. in U.S. Pat. No. 5,759,892 teach a method for making cylindrical capacitors in which the capacitor node contact plugs are recessed and polysilicon sidewall spacers are formed to prevent the IPO-2 from being overetched near the bit lines.

However, although there has been considerable work done to increase the capacitor area on these miniature stacked capacitors, there is still a need to fabricate crown capacitors without overetching the IPO-2 layer using a simple and manufacturable process.

SUMMARY OF THE INVENTION

A principal object of the present invention is to fabricate improved crown-shaped capacitors over bit lines (COB) for DRAM cells.

Another object of this invention is to utilize a polysilicon node contact plugs that extends above a second interpolysilicon oxide (IPO-2) to improve the process window and to minimize unwanted overetching that would otherwise cause reliability problems (bit line to capacitor shorts).

A method is described for making an array of crown-shaped capacitors that are more reliable than the traditional crown-shaped capacitors. The capacitors are formed on partially completed DRAM devices on a semi-conductor substrate. Typically the substrate is a single-crystal silicon substrate doped with a P type conductive dopant, such as boron (B). A relatively thick Field OXide (FOX) is formed surrounding and electrically isolating an array of device areas for memory cells on the substrate. The field oxide can be formed by the LOCal Oxidation of Silicon (LOCOS) method, commonly practiced in the industry. Other field oxide isolations can also be used, such as shallow trench isolation (STI) and the like to further increase circuit density. These partially completed DRAMs also include field effect transistors (FETS) in the device areas, one FET in each DRAM cell area. Typically the FETs consist of a thin gate oxide on the device areas, and gate electrodes formed from a patterned polycide layer. The FETs also have source/drain areas, one on each side and adjacent to the FET gate electrodes.

Continuing, a first insulating layer, commonly referred to as an interpolysilicon oxide-1 (IPO-1), is deposited over the device areas and the FOX areas to insulate the devices on the partially completed DRAM circuit. The first insulating layer is typically silicon oxide ($SiO_2$) or a doped glass such as borophosphosilicate glass (BPSG), and is deposited by low-pressure chemical vapor deposition (LPCVD). The first insulating layer is then planarized, for example by chemical/mechanical polishing (CMP), and bit-line contact openings are etched in the first insulating layer to one of the source/drain areas in each device area. Next, a polycide layer is deposited and patterned to form bit lines which make contact to one of the source/drain areas in each device area. A planar second insulating layer, commonly referred to as IPO-2, is formed over the bit lines. A first etch-stop layer composed of silicon oxynitride (SiON) is deposited on the second insulating layer. Now, by the method of this invention, a disposable layer is deposited on the first etch-stop layer. The disposable layer is preferably composed of an undoped silicon glass (USG). Contact openings for capacitor node contacts are etched in the disposable USG layer, the SiON first etch-stop layer and in the second and the first insulating layers to the second source/drain area of each memory device area. An in-situ doped polysilicon layer is deposited sufficiently thick to fill the contact openings, and is etched back or chem/mech polished back to the disposable oxide layer to form capacitor node contact plugs in the contact openings. The $SiO_2$ disposable layer is selectively removed in a hydrofluoric (HF) acid solution, which leaves essentially unetched the SiON first etch-stop layer and the polysilicon node contact plugs. This HF etch results in the upper portions of the polysilicon node contact plugs extending above the SiON first etch-stop layer to a height equal to the thickness of the disposable oxide layer. A blanket conformal second etch-stop layer, preferably composed of silicon nitride ($Si_3N_4$), is deposited over the exposed portions of the node contact plugs. A relatively thick third insulating layer is deposited. Then, a photoresist mask and anisotropic plasma etching are used to etch openings in the third insulating layer in which the crown capacitors will be formed. The capacitor openings are aligned over the polysilicon node contact plugs. The second and first etch-stop layers and the upper extensions of the node contact plugs allow the third insulating layer to be overetched to expose the node contact plugs without overetching into the second insulating layer on the bit lines. This method prevents capacitor-to-bit line shorts, as described in the prior art. Also, the upper extensions of the node contact plugs allow greater latitude (process window) in overetching the third insulating layer to expose the node contact plugs to compensate for variation in thickness and etch rate across the wafer. Next, the second etch-stop layer in the capacitor openings is removed by anisotropic plasma etching to expose the top surface of the node contact plugs, while the $Si_3N_4$ sidewall spacers on the node contact plugs further protect the node contact plugs. A conformal first conducting layer, such as a doped polysilicon, is deposited and polished back to the surface of the third insulating layer to form capacitor bottom electrodes in the capacitor openings. A thin interelectrode dielectric layer having a high dielectric constant (high-k), such as $SiO_2/Si_3N_4/SiO_2$ (ONO), is deposited on the bottom electrodes. A second conducting layer, such as a doped polysilicon, is deposited and patterned to form capacitor top electrodes and complete the array of capacitors.

BRIEF DESCRIPTION OF THE DRAWINGS

The objects and advantages of this invention are best understood with reference to the attached drawings and the embodiment that follows.

FIGS. 1 through 4 show schematic cross-sectional views of the prior art for making a conventional crown-shaped capacitor on DRAM devices that depict the overetching reliability problem.

FIGS. 5 through 11 show schematic cross-sectional views of an improved crown-shaped capacitor formed by the sequence of process steps by the method of this invention, that allow overetching without the reliability problem of the prior art.

DESCRIPTION OF THE PREFERRED EMBODIMENT

Figure 6:
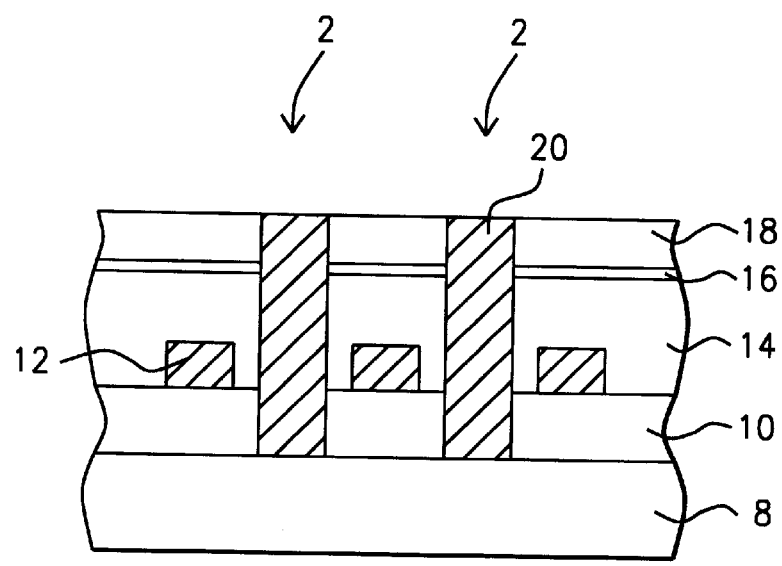

The method for making these crown-shaped capacitors with improved reliability for DRAM devices is now described in detail. The invention utilizes polysilicon node contact plugs that extend above a second interpolysilicon oxide (IPO-2) to improve the process window. This allows the openings for crown capacitors to be etched in a thick insulating layer to the node contact plugs without overetching the underlying second interpolysilicon oxide (IPO-2). The method of this invention eliminates unwanted overetching that would otherwise cause shorts between bit lines and capacitors.

Although the method is described only for making crown capacitors to memory cells having N-channel FETs, it should also be well understood by one skilled in the art that by including additional process steps, in addition to those described in this embodiment, other types of devices can also be included on the DRAM chip. For example, by forming N-well regions in a P doped substrate, P-channel FETs can be provided from which Complementary Metal-Oxide-Semiconductor (CMOS) circuits can also be formed, such as are used for the peripheral circuits on the DRAM chip.

Referring now to FIG. 5, a schematic cross-sectional view of a portion of a semiconductor substrate 8 is shown having partially completed DRAM cells which are not explicitly depicted in the figures to simplify the drawings. Typically the substrate 8 is composed of a lightly doped P type single-crystal silicon having a <100> crystallographic orientation and having an array of memory cell areas surrounded and electrically isolated by a field oxide. Each cell area has a single N-channel FET that has a gate oxide, a gate electrode formed from a patterned polycide layer, and having two N doped source/drain areas in the substrate adjacent to the FET gate electrode.

Still referring to FIG. 5, a first insulating layer 10, commonly referred to as an interpolysilicon oxide1 (IPO-1), is deposited over the device areas and the FOX areas to insulate the devices on the partially completed DRAM circuit. The first insulating layer 10 is typically silicon oxide ($SiO_2$) deposited by LPCVD using tetra-ethosiloxane (TEOS) as the reactant gas. Alternatively dopants such as boron and phosphorus can be added to layer 10 during deposition to form a borophosphosilicate glass (BPSG). The IPO-1 layer 10 is then planarized, for example, by chem/mech polishing to leave a thickness of between about 2500 and 6500 Angstroms over the FET devices. Bit-line contact openings (not shown) are etched in the first insulating layer 10 to one of the two source/drain areas in each memory cell area. A polycide layer 12 is deposited and patterned by photoresist masking and anisotropic plasma etching to form bit lines 12. The polycide layer 12 is typically composed of a polysilicon layer, deposited by LPCVD using a reactant gas such as silane ($SiH_4$). The polysilicon is deposited to a thickness of between about 500 and 2000 Angstroms, and is doped with an N type dopant such as phosphorus to a concentration of between about 1.0 E 19 and 1.0 E 21 atoms/cm$^3$. A refractory metal silicide layer such as tungsten silicide ($WSi_x$), is deposited on the polysilicon to form the polycide layer 12. The tungsten silicide is preferably deposited by LPCVD using a reactant gas mixture such as tungsten hexafluoride ($WF_6$) and $SiH_4$. The silicide layer is deposited to a preferred thickness of between about 1000 and 2000 Angstroms.

Continuing with FIG. 5, a planar second insulating layer 14, commonly referred to as IPO-2, is formed over the bit lines 12. The IPO-2 layer 14 is preferably a BPSG. The IPO-2 layer is deposited by LPCVD and is planarized to have a thickness of between about 4500 and 8000 Angstroms. A first etch-stop layer 16 is deposited on the IPO-2 layer 14. Layer 16 is preferably composed of silicon oxynitride (SiON), and is deposited using LPCVD and a reactant gas mixture of $SiH_4$, nitrous oxide ($N_2O$), and ammonia ($NH_3$). The first etch-stop layer 16 is deposited to a thickness of between about 50 and 300 Angstroms.

Still referring to FIG. 5, and by the method of this invention, a disposable layer 18 is deposited on the first etch-stop layer. The disposable layer 18 is preferably composed of an undoped silicon glass (USG). For example, USG layer 18 can be a $SiO_2$ deposited by LPCVD using TEOS or TEOS and ozone as the reactant gas mixture. The USG layer 18 is deposited to a thickness necessary to compensate for non-uniformities in oxide thicknesses and etch rate uniformities across the wafer, as will become evident in later process steps, but in general layer 18 would have a thickness of between about 1000 and 2000 Angstroms.

Referring to FIG. 6, contact openings 2 for capacitor node contacts are anisotropically etched in the disposable USG layer 18, the SiON first etch-stop layer 16 and in the second and the first insulating layers 14 and 12 to the second source/drain area of each memory device area on the substrate 8. The contact openings 2 are etched preferably using high-density-plasma (HDP) etching and an etchant gas mixture such as carbon tetrafluoride ($CF_4$), trifluoromethane ($CHF_3$), and argon (Ar). Next, the capacitor node contact plugs are formed by depositing an in-situ doped polysilicon layer 20 sufficiently thick to fill the contact openings 2. The polysilicon layer 20 is deposited by LPCVD using a reactant gas such as $SiH_4$, and is in-situ doped with phosphorus using a dopant gas such as phosphine ($PH_3$). Layer 20 is doped to a concentration of between about 1.0 E 19 and 1.0 E 21 atoms/cm$^3$. The polysilicon layer 20 is then etched back or chem/mech polished back to the surface of the disposable oxide layer 18 to form capacitor node contact plugs 20 in the contact openings 2.

Figure 7:
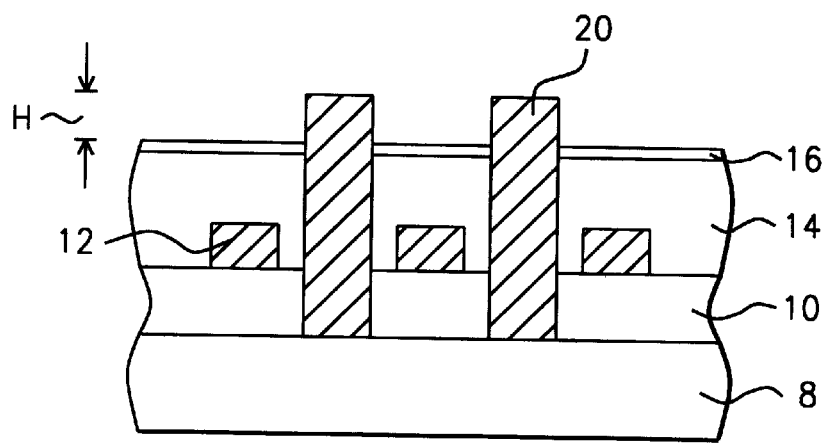

Referring to FIG. 7, the $SiO_2$ disposable layer 18 is now selectively removed to the surface of the first etch-stop layer 16 using a hydrofluoric (HF) acid solution, which leaves essentially unetched the SiON first etch-stop layer 16 and the polysilicon node contact plugs 20. This HF etch results in the upper portions of the polysilicon node contact plugs 20 extending above the SiON first etch-stop layer 16 to a height H about equal to the thickness of the disposable oxide layer 18.

Figure 8:
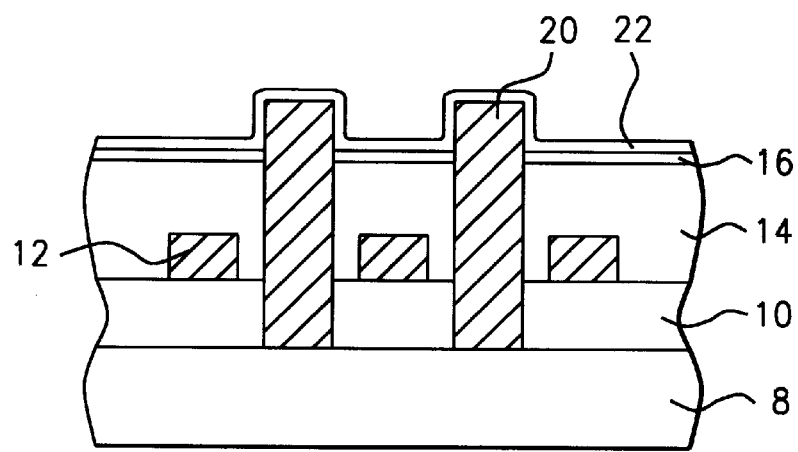

Referring now to FIG. 8, a blanket conformal second etch-stop layer 22 is deposited over the exposed portions of the node contact plugs 20. Layer 22 is preferably composed of silicon nitride ($Si_3N_4$), and is deposited preferably by LPCVD using dichlorosilane ($SiCl_2H_2$) and $NH_3$ as the reactant gases. The second etch-stop layer 22 is deposited to a thickness of between about 50 and 250 Angstroms.

Figure 9:
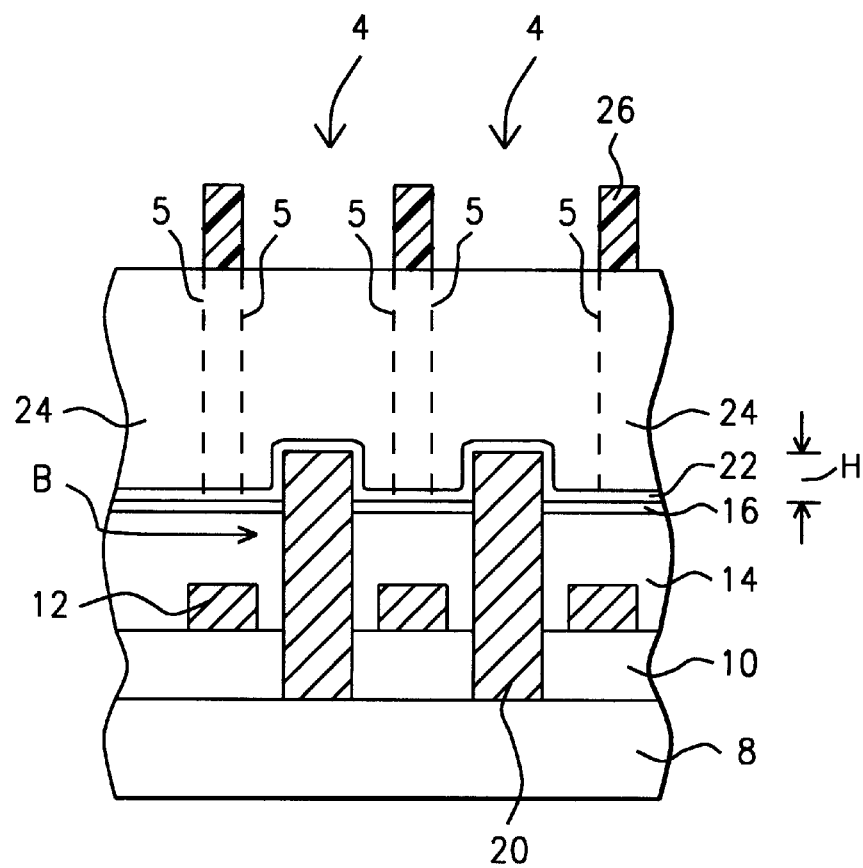

Referring to FIG. 9, a relatively thick third insulating layer 24 is deposited on the second etch-stop layer 22. Layer 24 is preferably $SiO_2$, and is deposited by LPCVD using TEOS as the reactant gas. The third insulating layer 24 is deposited to a thickness about equal to the desired height of the crown capacitors, and more specifically to a thickness of between about 8000 and 15000 Angstroms.

Still referring to FIG. 9, a patterned photoresist etch mask 26 is then used to etch openings 4 in the third insulating layer 24 for crown capacitors. The openings 4 are aligned over the node contact plugs 20 that extend above the first etch-stop layer 16 by a height H. Since the disposable oxide layer 18 can be deposited very uniformly across the wafer, the height H of the plugs is also very uniform across the wafer. These extended plugs allow one to overetch the openings 4 for the capacitors without overetching the underlying IPO-2 layer 14. The first etch-stop layer 16 and the second etch-stop layer 22 on the sidewalls of the plugs also protect the IPO-2 layer 14 when the third insulating layer 24 is overetched to form the capacitor openings 4. This overetching ability will become very important in future manufacturing when 300 mm (diameter) wafers will reach production. By way of example only, if the disposable oxide layer 18 is 2000 Angstroms thick with a 10% non-uniformity (about 200 Angstroms), then the height H of the extended plugs will be 1900–2100 Angstroms across the wafer. Therefore, for a thick oxide layer 24, for example 10000 Angstroms necessary to form the crown capacitors, and having a 10% non-uniformity across the wafer, the capacitors openings 4 can be easily overetched across a 300 mm wafer to expose all the plugs 20 without etching into the IPO-2 layer 14 (in area B). This method makes for a very repeatable process with high process yield (all plugs are exposed), which will be required as the bit count on DRAMs increases.

Anisotropic plasma etching is used to etch the openings 4 in the third insulating layer 24, as depicted by the dashed lines 5 in FIG. 9. The etching is carried out preferably using a high-density-plasma etcher and an etchant gas mixture such as $CF_4$, $CHF_3$, $C_4F_8$, CO and Ar, which selectively etches the $SiO_2$ layer 24 to the $Si_3N_4$ layer 22, and having an etch-rate ratio of $SiO_2$ to $Si_3N_4$ greater than about 10:1. The second $Si_3N_4$ etch-stop layer 22 is then removed to expose the top surface of the plugs 20 using a HDP etcher and a etchant gas mixture such as $CF_4$ and $CHF_3$.

Figure 10:
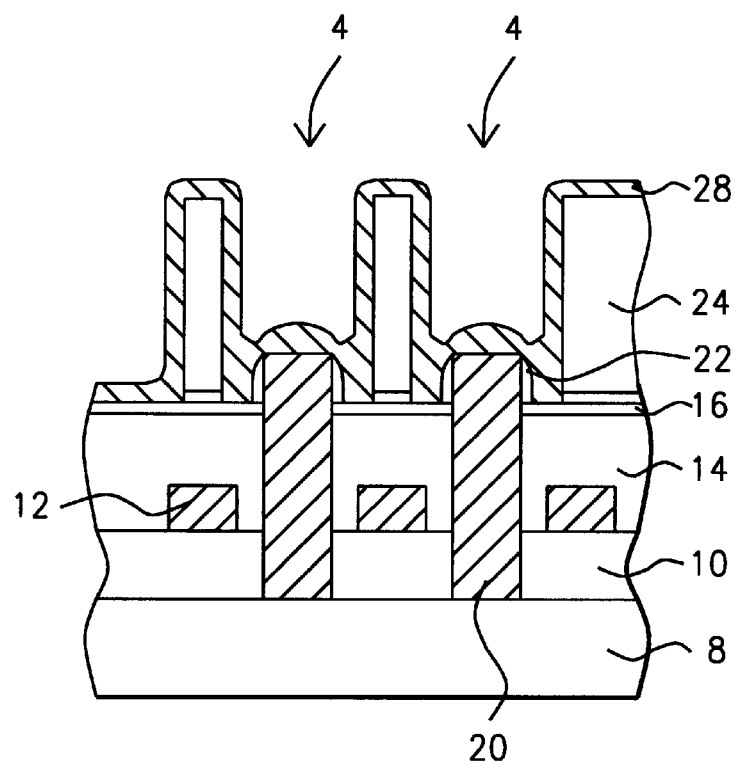

Referring to FIG. 10, after removing the second etch-stop layer 22 and the photoresist mask 26, a conformal first conducting layer 28 is deposited to form the capacitor bottom electrodes. Layer 28 is preferably an in-situ doped polysilicon, deposited by LPCVD using $SiH_4$, and is doped with phosphorus using $PH_3$ as the dopant gas. The conducting layer 28 has a preferred thickness of between about 500 and 1500 Angstroms, and is doped to a concentration of between about 5.0 E 19 and 6.0 E 20 atoms/cm$^3$.

Figure 11:
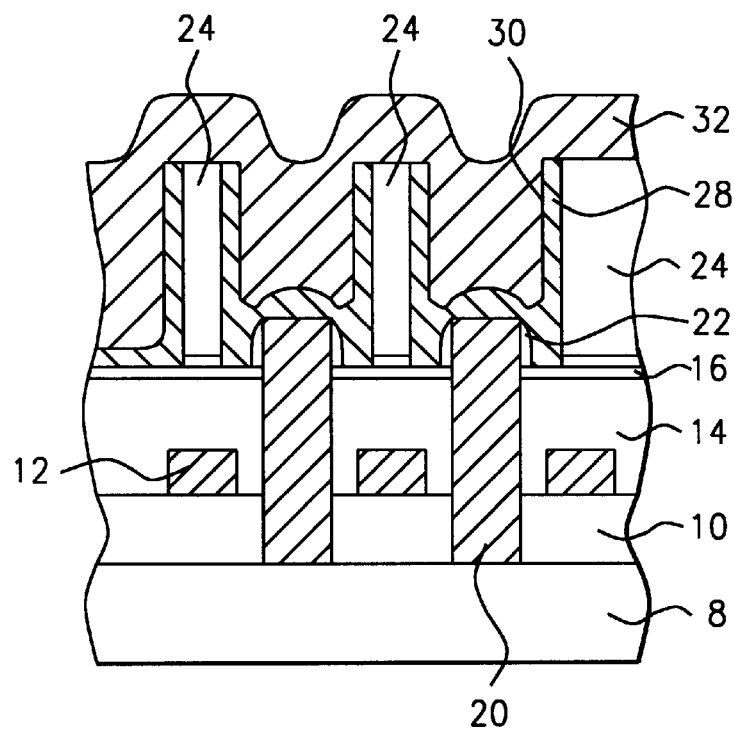

Referring to FIG. 11, the polysilicon first conducting layer 28 is polished back to the surface of the third insulating layer 24 to form capacitor bottom electrodes, also labeled 28, in the capacitor openings 4. The polishing is carried using chem/mech polishing as commonly practiced in the industry.

Referring still to FIG. 11, a thin interelectrode dielectric layer 30, that has a high dielectric constant (high-k), is formed on the surface of the bottom electrodes 28. The dielectric layer 30 is preferably composed of layers of $SiO_2/Si_3N_4/SiO_2$ (ONO). The ONO dielectric layer can be formed by first growing a thin thermal oxide (e.g., 5 Angstroms) on the polysilicon bottom electrodes 28. A $Si_3N_4$ layer having a thickness of about 45 to 70 Angstroms is deposited by LPCVD. Then a thin $SiO_2$ is formed using an oxidation furnace to partially reduce the $Si_3N_4$ layer to form a top $SiO_2$ layer that provides a pin-hole-free ONO layer. Alternatively, the dielectric layer 30 can be other high-dielectric constant materials, such as tantalum pentoxide ($Ta_2O_5$) or can be used in conjunction with ONO to form the high-dielectric-constant layer 30.

Still referring to FIG. 11, the crown capacitors are now completed by depositing a conformal second conducting layer 32. Layer 32 is preferably a doped polysilicon deposited by LPCVD using a reactant gas such as $SiH_4$, and is in-situ doped with phosphorus using a dopant gas such as $PH_3$. The polysilicon layer 32 is doped to a preferred concentration of between about 5.0 E 19 and 1.0 E 21 atoms/cm$^3$. The preferred thickness of the polysilicon layer 32 is between about 800 and 2000 Angstroms. Layer 32 is then patterned to form the capacitor top electrodes.

While the invention has been particularly shown and described with reference to the preferred embodiment thereof, it will be understood by those skilled in the art that various changes in form and details may be made without departing from the spirit and scope of the invention.

What is claimed is:

1. An improved process for fabricating an array of crown-shaped capacitors on a dynamic random access memory (DRAM) device comprising the steps of: providing a semiconductor substrate having field oxide areas surrounding device areas, said device areas having semiconductor devices;

depositing a first insulating layer over said device areas and said field oxide areas;

planarizing said first insulating layer;

depositing a polycide layer over said first insulating layer and patterning to form bit lines having contacts through said first insulating layer to said device areas;

forming a planar second insulating layer over said bit lines;

depositing a first etch-stop layer on said second insulating layer;

depositing a disposable layer on said first etch-stop layer;

etching contact openings in said disposable layer, said first etch-stop layer and in said second and said first insulating layers to said device areas for capacitor node contacts;

depositing a doped polysilicon layer sufficiently thick to fill said contact openings;

etching back said polysilicon layer to said disposable layer to form capacitor node contact plugs in said contact openings;

selectively removing said disposable layer to said first etch-stop layer, and leaving portions of said node contact plugs extending above said first etch-stop layer a distance equal to the thickness of said disposable layer;

depositing a blanket conformal second etch-stop layer over said node contact plugs;

depositing a third insulating layer;

etching openings in said third insulating layer for capacitors aligned over said node contact plugs and removing said second etch-stop layer to expose top surface of said node contact plugs while forming sidewall spacers on said node contact plugs;

depositing a conformal first conducting layer and polishing back to form capacitor bottom electrodes in said openings;

forming an interelectrode dielectric layer on said bottom electrodes;

depositing and patterning a second conducting layer to form capacitor top electrodes, thereby completing said array of crown-shaped capacitors.

2. The method of claim 1, wherein said first insulating layer is composed of a borophosphosilicate glass is deposited to a thickness of between about 2500 and 6500 Angstroms.

3. The method of claim 1, wherein said polycide layer is composed of a doped polysilicon layer deposited to a thickness of between about 500 and 2000 Angstroms and doped with phosphorus to a concentration of between about 1.0 E 19 and 1.0 E 21 atoms/cm$^3$, and an upper tungsten silicide layer deposited to a thickness of between about 1000 and 2000 Angstroms.

4. The method of claim 1, wherein said second insulating layer is composed of a borophosphosilicate glass is deposited to a thickness of between about 4500 and 8000 Angstroms.

5. The method of claim 1, wherein said first etch-stop layer is silicon oxynitride and is deposited to a thickness of between about 50 and 300 Angstroms.

6. The method of claim 1, wherein said disposable layer is an undoped silicon glass deposited to a thickness of between about 1000 and 2000 Angstroms.

7. The method of claim 1, wherein said polysilicon layer is deposited by low-pressure chemical vapor deposition and is in-situ doped with phosphorus to a concentration of between about 1.0 E 19 and 1.0 E 21 atoms/cm$^3$.

8. The method of claim 1, wherein said disposable layer is selectively etched in a hydrofluoric acid solution.

9. The method of claim 1, wherein said second etch-stop layer is silicon nitride and is deposited to a thickness of between about 50 and 250 Angstroms.

10. The method of claim 1, wherein said third insulating layer is silicon oxide deposited by low-pressure chemical vapor deposition to a thickness of between about 8000 and 15000 Angstroms.

11. The method of claim 1, wherein said first conducting layer is a polysilicon layer deposited to a thickness of between about 500 and 1500 Angstroms and is in-situ doped with phosphorus to a concentration of between about 5.0 E 19 and 6.0 E 20 atoms/cm$^3$.

12. The method of claim 1, wherein said interelectrode dielectric layer is composed of silicon oxide/silicon nitride/silicon oxide (ONO) and has a total thickness of between about 100 and 250 Angstroms.

13. The method of claim 1, wherein said second conducting layer is a polysilicon layer deposited to a thickness of between about 800 and 2000 Angstroms and is in-situ doped with phosphorus to a concentration of between about 5.0 E 19 and 1.0 E 21 atoms/cm$^3$.

14. An improved process for fabricating an array of crown-shaped capacitors on a dynamic random access memory (DRAM) device comprising the steps of:

provoking a semiconductor substrate having field oxide areas surrounding device areas, said device areas having semiconductor devices;

depositing a first insulating layer over said device areas and said field oxide areas;

planarizing said first insulating layer;

depositing a polycide layer over said first insulating layer and patterning to form bit lines having contacts through said first insulating layer to said device areas;

forming a planar second insulating layer over said bit lines;

depositing a first etch-stop layer composed of silicon oxynitride on said second insulating layer;

depositing a disposable layer composed of an undoped silicon glass on said first etch-stop layer;

etching contact openings in said disposable layer, said first etch-stop layer and in said second and said first insulating layers to said device areas for capacitor node contacts;

depositing a doped polysilicon layer sufficiently thick to fill said contact openings;

etching back said polysilicon layer to said disposable layer to form capacitor node contact plugs in said contact openings;

selectively removing said disposable layer in a hydrofluoric acid solution to said first etch-stop layer, and leaving portions of said node contact plugs extending above said first etch-stop layer a distance equal to the thickness of said disposable layer;

depositing a blanket conformal second etch-stop layer composed of silicon nitride over said node contact plugs;

depositing a third insulating layer;

etching openings in said third insulating layer for capacitors aligned over said node contact plugs and removing said second etch-stop layer to expose top surface of said node contact plugs while forming sidewall spacers on said node contact plugs;

depositing a conformal first conducting layer and polishing back to form capacitor bottom electrodes in said openings;

forming an interelectrode dielectric layer on said bottom electrodes;

depositing and patterning a second conducting layer to form capacitor top electrodes, thereby completing said array of crown-shaped capacitors.

15. The method of claim 14, wherein said first insulating layer is composed of a borophosphosilicate glass is deposited to a thickness of between about 2500 and 6500 Angstroms.

16. The method of claim 14, wherein said polycide layer is composed of a doped polysilicon layer deposited to a thickness of between about 500 and 2000 Angstroms and doped with phosphorus to a concentration of between about 1.0 E 19 and 1.0 E 21 atoms/cm$^3$, and an upper tungsten silicide layer deposited to a thickness of between about 1000 and 2000 Angstroms.

17. The method of claim 14, wherein said second insulating layer is composed of a borophosphosilicate glass is deposited to a thickness of between about 4500 and 8000 Angstroms.

18. The method of claim 14, wherein said first etch-stop layer is deposited to a thickness of between about 50 and 300 Angstroms.

19. The method of claim 14, wherein said disposable layer is deposited to a thickness of between about 1000 and 2000 Angstroms.

20. The method of claim 14, wherein said polysilicon layer is deposited by low-pressure chemical vapor deposition and is in-situ doped with phosphorus to a concentration of between about 1.0 E 19 and 1.0 E 21 atoms/cm$^3$.

21. The method of claim 14, wherein said second etch-stop layer is deposited to a thickness of between about 50 and 250 Angstroms.

22. The method of claim 14, wherein said third insulating layer is silicon oxide deposited by low-pressure chemical vapor deposition to a thickness of between about 8000 and 15000 Angstroms.

23. The method of claim 14, wherein said first conducting layer is a polysilicon layer deposited to a thickness of between about 500 and 1500 Angstroms and is in-situ doped with phosphorus to a concentration of between about 5.0 E 19 and 6.0 E 20 atoms/cm$^3$.

24. The method of claim 14, wherein said interelectrode dielectric layer is composed of silicon oxide/silicon nitride/silicon oxide (ONO) and has a total thickness of between about 100 and 250 Angstroms.

25. The method of claim 14, wherein said second conducting layer is a polysilicon layer deposited to a thickness of between about 800 and 2000 Angstroms and is in-situ doped with phosphorus to a concentration of between about 5.0 E 19 and 1.0 E 21 atoms/cm$^3$.

* * * * *